United States Patent
Lee et al.

(10) Patent No.: US 7,303,850 B2
(45) Date of Patent: Dec. 4, 2007

(54) METHOD OF FABRICATING ORGANIC LIGHT EMITTING DISPLAY

(75) Inventors: Jae-Ho Lee, Suwon-si (KR); Tae-Min Kang, Suwon-si (KR); Seong-Taek Lee, Suwon-si (KR); Jin-Soo Kim, Yongin-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 11/020,669

(22) Filed: Dec. 27, 2004

(65) Prior Publication Data

US 2006/0063097 A1 Mar. 23, 2006

(30) Foreign Application Priority Data

Sep. 21, 2004 (KR) .................. 10-2004-0075659

(51) Int. Cl.
*H01J 9/227* (2006.01)
(52) U.S. Cl. .................. 430/200; 430/321; 445/24
(58) Field of Classification Search .................. None
See application file for complete search history.

(56) References Cited

U.S. PATENT DOCUMENTS 6,610,455 B1 * 8/2003 Burberry et al. ............ 430/200

2002/0098614 A1 * 7/2002 Akai ..................... 438/82

FOREIGN PATENT DOCUMENTS

| KR | 1020010076584 | 8/2001 |
| KR | 10-2003-0065371 | 8/2003 |
| KR | 1020040078281 | 9/2004 |

OTHER PUBLICATIONS

"A New Patterning Method for Full-Color Polymer Light-Emitting Devices: Laser Induced Thermal Imaging (LITI)" by Lee et al., SID 02 Digest, pp. 784-787 (2002).*

* cited by examiner

*Primary Examiner*—John A. McPherson
(74) *Attorney, Agent, or Firm*—H.C. Park & Associates, PLC

(57) ABSTRACT

A method of fabricating an organic light emitting display is provided. The method includes repeatedly scanning a laser beam over a predetermined region of a donor substrate with multi-lines in one step using a galvanometer to form an organic layer pattern. The method of the present invention is capable of reducing process time required to form the organic layer pattern and lowering manufacturing cost by repeating multi-line scanning in one step through the laser beam using the galvanometer, when the organic layer pattern is formed using an LITI method.

10 Claims, 5 Drawing Sheets

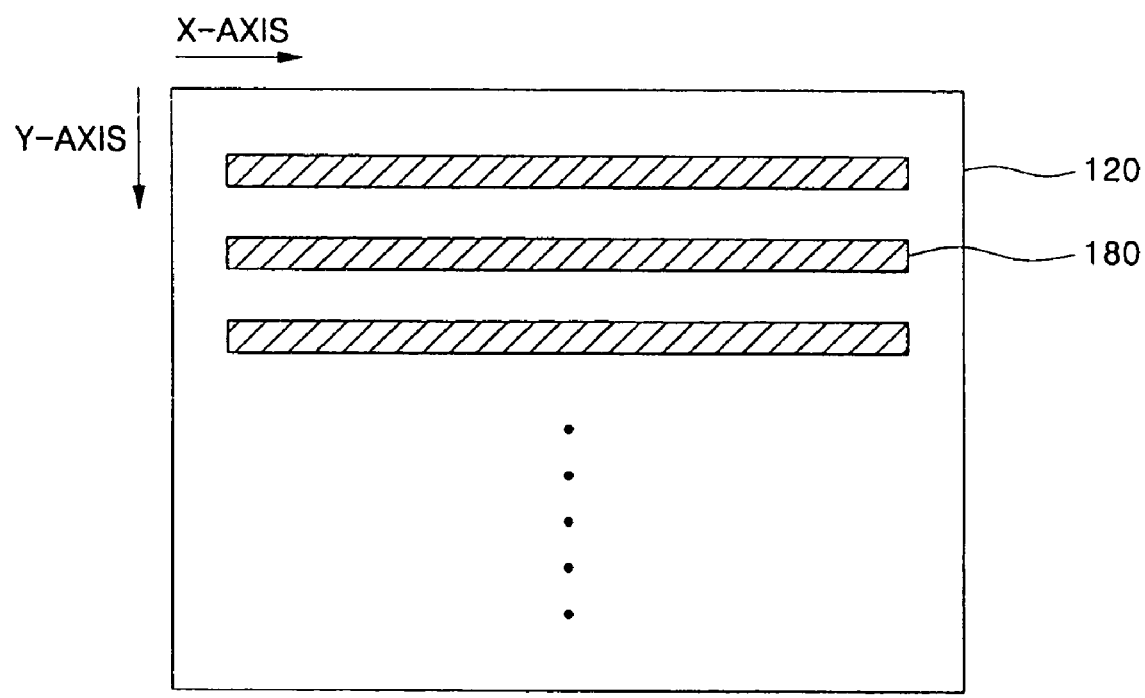

METHOD OF FABRICATING ORGANIC LIGHT EMITTING DISPLAY

CROSS-REFERENCE TO RELATED APPLICATION

This application claims priority to and the benefit of Korean Patent Application No. 2004-0075659, filed Sep. 21, 2004, the disclosure of which is incorporated herein by reference in its entirety.

BACKGROUND OF THE INVENTION

1. Field of the Invention

The present invention relates to a method of fabricating an organic light emitting display and, more particularly, to a method of fabricating an organic light emitting display scanning multi-lines through a laser beam in one step to form an organic layer pattern using a galvanometer.

2. Description of the Related Art

In general, an organic light emitting display (OLED) as a flat panel display includes an anode, a cathode, and organic layers interposed between the anode and the cathode. The organic layers include at least an emission layer, and may further include a hole injection layer, a hole transport layer, an electron transport layer, and an electron injection layer in addition to the emission layer. The OLED is classified into a polymer OLED and a small molecule OLED depending on material for forming the organic layer, especially the emission layer.

In this OLED, in order to implement a full color display, the emission layer should be patterned. A method of patterning the emission layer may employ a method of using a shadow mask in the case of the small molecule OLED, and an inkjet printing method or a laser induced thermal imaging (LITI) method in the case of the polymer OLED. Among them, the LITI method has advantages of finely patterning the organic layer, being used in a large-sized display, implementing high resolution, and using a dry etching method other than a wet etching method unlike the inkjet printing method.

FIGS. 1A and 1B are schematic views illustrating a conventional method of fabricating an OLED.

Referring to FIG. 1A, a donor substrate having an organic layer 130 is laminated on a substrate 110 having a pixel electrode.

A laser irradiator 100 includes a laser generator 140, a galvanometer 160, and a projection lens 170. A laser beam 150 generated from the laser generator 140 is refracted by the galvanometer 160 to scan a predetermined region of the donor substrate 120 through the projection lens 170.

Referring to FIG. 1B, the laser beam 150 refracted by the galvanometer 160 and passed through the projection lens 170 scans the predetermined region on the donor substrate 120 along the x-axis. Oblique line portions designate scanned lines 180. Next, the laser irradiator 100 moves in the y-axis direction of the donor substrate 120 as the next step. Continuously, the laser beam 150 refracted by the galvanometer 160 scans the predetermined region on the donor substrate 120 along the x-axis. Repeating this process, an organic layer pattern is formed on the substrate.

After the transfer process, a cathode is formed on the organic layer pattern to complete the OLED.

As described above, in the conventional art, the laser irradiator scans one line in one step and moves to another step to scan another line to thereby form the organic layer pattern using the galvanometer.

Therefore, in manufacturing a large-sized OLED, it may be time-consuming to form the organic layer pattern and therefore it is likely to increase manufacturing cost.

SUMMARY OF THE INVENTION

The present invention, therefore, solves aforementioned problems associated with conventional devices by providing a method of fabricating an OLED capable of reducing process time and manufacturing cost when an organic layer pattern is formed using an LITI method.

In an exemplary embodiment of the present invention, a method of fabricating an organic light emitting display includes: providing a substrate having a pixel electrode; laminating a donor substrate on an entire surface of the substrate; and scanning a laser beam over a predetermined region on the donor substrate to form an organic layer pattern on the substrate, wherein scanning the laser beam with multi-lines in one step using a galvanometer is repeated. As a result, it is possible to reduce process time and manufacturing cost for forming the organic layer pattern.

Scanning the laser beam with multi-lines in one step may include: scanning the predetermined region of the donor substrate in an x-axis direction using an x-galvanometer; and positioning the laser beam in a y-axis direction of the donor substrate using a y-galvanometer.

In addition, scanning the laser beam with multi-lines in one step may include: positioning the laser beam in a y-axis direction of the donor substrate using a y-galvanometer; and scanning the predetermined region of the donor substrate in an x-axis direction using an x-galvanometer.

Scanning multi-lines in one step using the x and y galvanometers may be repeated 4 to 6 times, preferably 5 times.

The organic layer pattern may be a single layer or a multi-layer made of at least two layers selected from a group consisting of an emission layer, a hole injection layer, a hole transport layer, an electron transport layer, and an electron injection layer.

BRIEF DESCRIPTION OF THE DRAWINGS

The above and other features of the present invention will be described in reference to certain exemplary embodiments thereof with reference to the attached drawings in which:

FIGS. 1A and 1B are schematic views illustrating a conventional method of fabricating an OLED;

DETAILED DESCRIPTION OF THE INVENTION

Figure 1A:
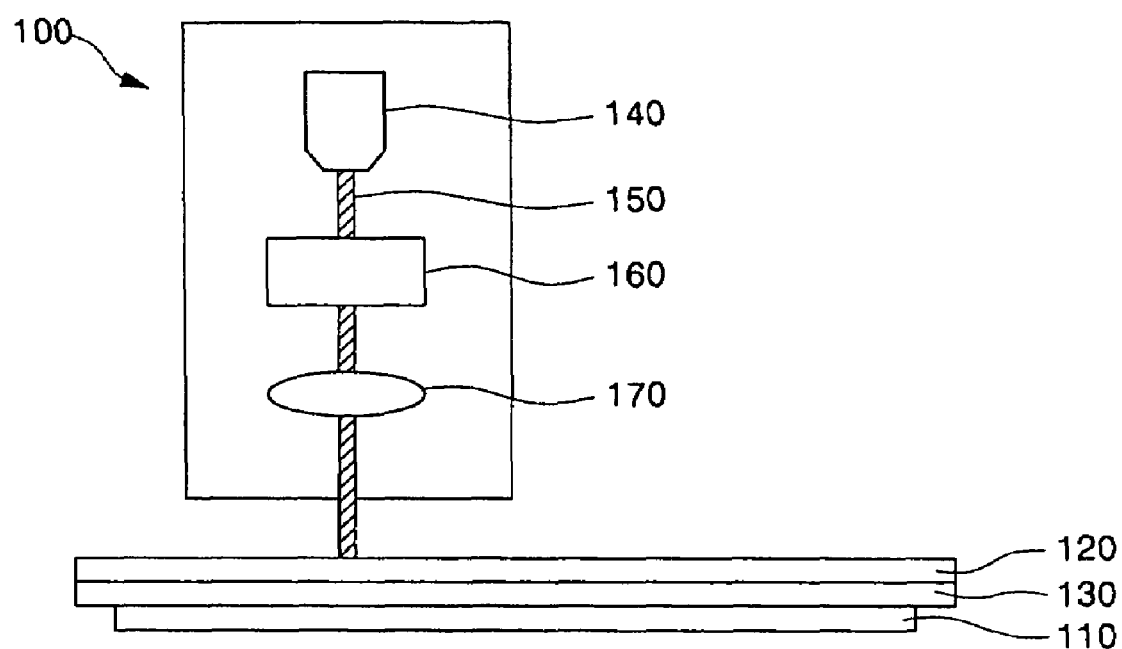

The present invention will now be described more fully hereinafter with reference to the accompanying drawings, in which preferred embodiments of the invention are shown. This invention may, however, be embodied in different forms and should not be construed as limited to the embodiments set forth herein. Like reference numerals designate like elements throughout the specification.

Figure 2A:
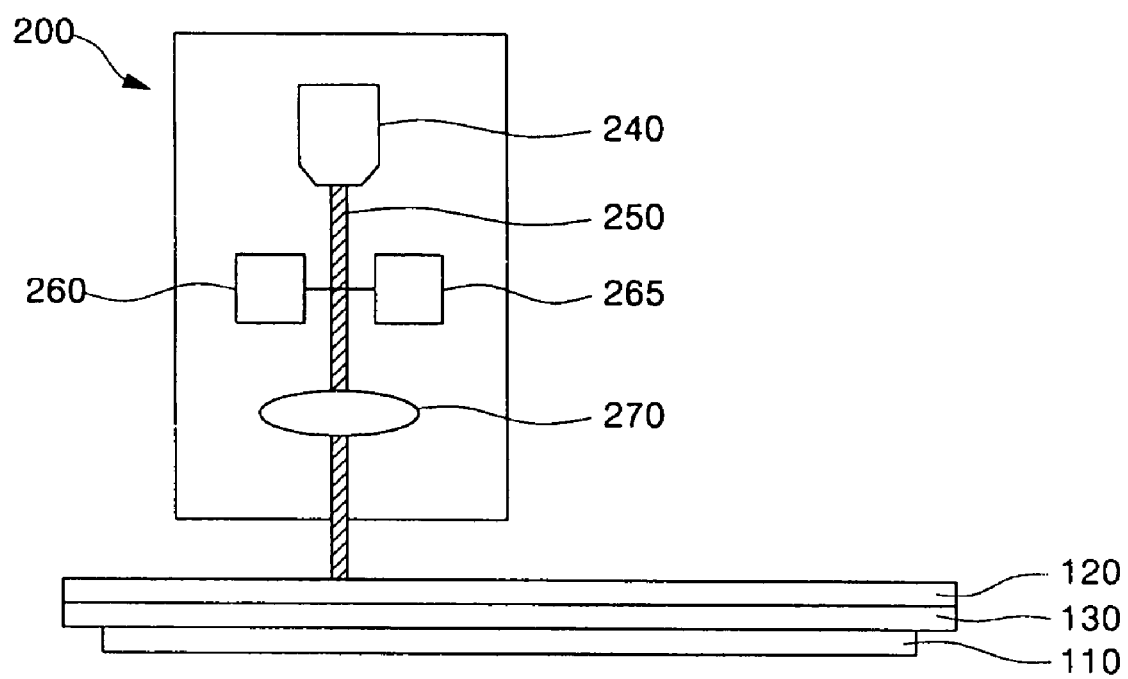
FIGS. 2A and 2B are schematic views illustrating a method of fabricating an OLED in accordance with the present invention.
Figure 2B:
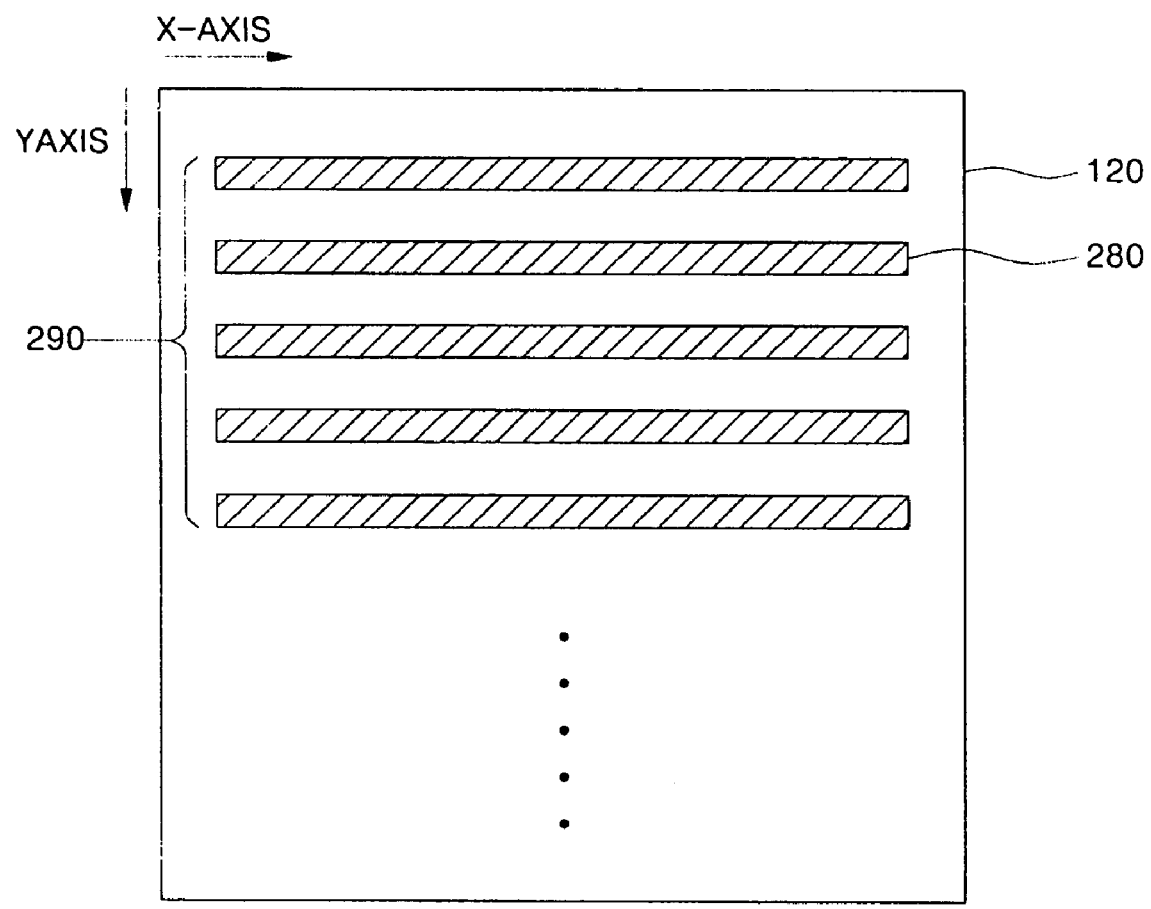

FIGS. 2A and 2B are schematic views illustrating a method of fabricating an OLED in accordance with the present invention.

Referring to FIG. 2A, a donor substrate 120 having an organic layer 130 is laminated on a substrate 110 having a pixel electrode.

A laser irradiator 200 includes a laser generator 240, an x-galvanometer 260, a y-galvanometer 265, and a projection lens 270. A laser beam 250 generated from the laser generator 240 is refracted by the x and y galvanometers 260 and 265 to scan a predetermined region on the donor substrate 120 with multi-lines through the projection lens.

Referring to FIG. 2B, the laser beam 250 refracted by the x-galvanometer 260 and passed through the projection lens 270 scans the predetermined region on the donor substrate 120 along the x-axis. Oblique line portions designate scanned lines 280.

Next, the laser beam 250 is positioned along y-axis of the donor substrate by the y-galvanometer 265. That is, the laser beam 250 is moved by one pitch along a y-axis direction in order to scan lines next to the lines scanned along the x-axis. The pitch means a distance between the scanned line and the next line.

Continuously, the laser beam 250 scans the predetermined region of the donor substrate 120 along the x-axis using the x-galvanometer 260.

Then, the laser beam 250 is positioned along the y-axis of the donor substrate 120 by the y-galvanometer 265.

In addition, first, the laser beam 250 may be positioned along the y-axis of the donor substrate 120 by the y-galvanometer 265. That is, after positioning by the y-galvanometer 265, the laser beam 250 may scan the predetermined region on the donor substrate 120 using the x-galvanometer 260.

Next, the laser beam 250 is positioned along the y-axis of the donor substrate 120 by the y-galvanometer 265.

As described above, an organic layer pattern is formed on the donor substrate 120 by repeating the x-axis direction scan of the donor substrate using the x-galvanometer 260 and the y-axis direction positioning of the donor substrate using the y-galvanometer 265.

That is, the donor substrate is scanned with multi-lines to form the organic layer pattern in one step of the transfer process of forming the organic layer pattern. The scan using the x and y galvanometers 260 and 265 may be repeated 4 to 6 times. In particular, preferably, the scan using the x and y galvanometers 260 and 265 is repeated 5 times to reduce the process time. FIG. 2B illustrates the case of 5 lines scanned in one step. Detailed description will be explained in FIG. 3.

After forming a portion of the organic layer pattern by scanning with multi-lines in one step of the transfer process, the laser beam is moved to the next step to repeatedly scan with multi-lines using the same method to form the organic layer pattern. That is, the multi line scan is repeated in each step to complete the transfer process.

The process of forming the organic layer pattern may be performed in an $N_2$ atmosphere. Since the general atmosphere contains an $O_2$ component, which may oxidize the transferred organic layer pattern, the transfer process is preferably performed in the $N_2$ atmosphere without the $O_2$ component.

In addition, the transfer process may be performed in a vacuum atmosphere, which have an effect capable of suppressing bubble generation between the donor substrate and the substrate during lamination of the donor substrate on an entire surface of the substrate.

The organic layer pattern may be a single layer or a multi-layer made of at least two layers selected from a group consisting of an emission layer, a hole injection layer, a hole transport layer, an electron transport layer, and an electron injection layer.

After the transfer process, a cathode is formed on the organic layer pattern to complete the OLED.

Figure 3:
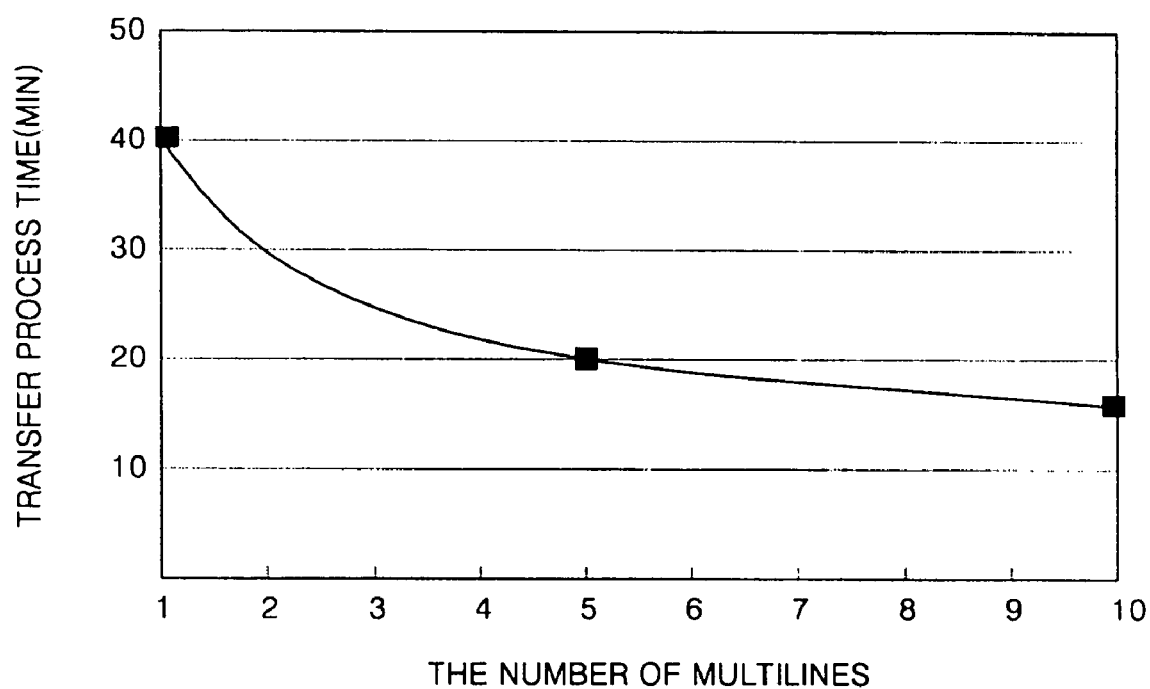
FIG. 3 is a graph representing process time required to transfer one color depending on the number of lines scanned in one step.

FIG. 3 is a graph representing process time required to transfer one color depending on the number of lines scanned in one step, which represents transfer process time required to transfer one color while manufacturing 15.5" WXGA grade panel.

Referring to FIG. 3, when one line is scanned in one step and it is repeated to complete the transfer process, it takes about 40 minutes. On the other hand, when 4 to 6 lines are scanned in one step and it is repeated to complete the transfer process, it takes about 18 to 22 minutes, especially, when 5 lines are scanned, it takes about 20 minutes. That is, it will be appreciated that the transfer process time of the present invention is reduced by about 20 minutes in comparison with the conventional art scanning one line in one step.

It is appreciated that when 10 lines are scanned in one step, it takes about 16 minutes, i.e., the shortest process time is consumed. However, when the 10 lines are scanned in one step, it may be difficult to adjust a focus through the projection lens, or may distort the scan line.

Therefore, scanning 4 to 6 lines, preferably 5 lines in one step is advantageous to reduce the transfer process time and maintain transfer efficiency.

As can be seen from the foregoing, a method of fabricating an OLED of the present invention is capable of reducing process time required to form an organic layer pattern and lowering manufacturing cost by repeating multi-line scanning in one step through a laser beam using a galvanometer, when the organic layer pattern is formed using an LITI method.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating an organic light emitting display, comprising:
   providing a substrate having a pixel electrode;
   laminating a donor substrate on an entire surface of the substrate; and
   scanning a laser beam over a predetermined region on the donor substrate to form an organic layer pattern on the substrate,
   wherein scanning the laser beam with multi-lines in one step using an x-galvanometer and a y-galvanometer is repeated.

2. The method according to claim 1, wherein scanning the laser beam with multi-lines in one step comprises:
   scanning the predetermined region of the donor substrate in an x-axis direction using the x-galvanometer; and
   positioning the laser beam in a y-axis direction of the donor substrate using the y-galvanometer.

3. The method according to claim 2, wherein scanning the predetermined region of the donor substrate in the x-axis direction using the x-galvanometer and positioning the laser beam in the y-axis direction of the donor substrate using the y-galvanometer are repeated 4 to 6 times.

4. The method according to claim 2, wherein scanning the predetermined region of the donor substrate in the x-axis direction using the x-galvanometer and positioning the laser beam in the y-axis direction of the donor substrate using the y-galvanometer are repeated 5 times.

5. The method according to claim 1, wherein scanning the laser beam with multi-lines in one step comprises:
   positioning the laser beam in a y-axis direction of the donor substrate using the y-galvanometer; and
   scanning the predetermined region of the donor substrate in an x-axis direction using the x-galvanometer.

6. The method according to claim 5, wherein positioning the laser beam in the y-axis direction of the donor substrate using the y-galvanometer and scanning the predetermined region of the donor substrate in the x-axis direction using the x-galvanometer are repeated 4 to 6 times.

7. The method according to claim 5, wherein positioning the laser beam in the y-axis direction of the donor substrate using the y-galvanometer and scanning the predetermined region of the donor substrate in the x-axis direction using the x-galvanometer are repeated 5 times.

8. The method according to claim 1, wherein forming the organic layer pattern on the pixel electrode is performed in an N2 atmosphere.

9. The method according to claim 1, wherein forming the organic layer pattern on the pixel electrode is performed in a vacuum atmosphere.

10. The method according to claim 1, wherein the organic layer pattern is a single layer or a multi-layer made of at least two layers selected from a group consisting of an emission layer, a hole injection layer, a hole transport layer, an electron transport layer, and an electron injection layer.

* * * * *